United States Patent [19]
Choi

[11] Patent Number: 6,011,729
[45] Date of Patent: Jan. 4, 2000

[54] MULTILEVEL MEMORY DEVICES WITH MULTI-BIT DATA LATCHES

[75] Inventor: Byung-Sun Choi, Kyunggi-do, Rep. of Korea

[73] Assignee: Samsung Electronics Co., Ltd., Rep. of Korea

[21] Appl. No.: 09/215,710

[22] Filed: Dec. 18, 1998

[30] Foreign Application Priority Data

Dec. 29, 1997 [KR] Rep. of Korea ............ 97 77264

[51] Int. Cl.[7] ............................................. G11C 7/00
[52] U.S. Cl. ............................ 365/189.05; 365/191
[58] Field of Search ............................. 365/189.05, 191

[56] References Cited

U.S. PATENT DOCUMENTS

| | | | |
|---|---|---|---|
| 5,218,569 | 6/1993 | Banks | 365/186 X |
| 5,457,650 | 10/1995 | Sugiura et al. | 365/168 X |
| 5,761,132 | 6/1998 | Kim | 365/189.05 X |
| 5,768,188 | 6/1998 | Park et al. | 365/189.05 X |
| 5,784,331 | 7/1998 | Lysinger | 365/189.05 X |

*Primary Examiner*—Do Hyun Yoo
*Attorney, Agent, or Firm*—Myers Bigel Sibley & Sajovec

[57] ABSTRACT

A multi-bit data latch includes a gated input buffer having a buffer input terminal, a buffer output terminal, and a buffer control terminal. The gated input buffer provides an output signal at the buffer output terminal responsive to an input signal applied to the buffer input terminal subject to a buffer control signal at the buffer control terminal. A first latch circuit has a first latch output terminal and a first latch input terminal, and a second latch circuit has a second latch output terminal and a second latch input terminal. A first switching circuit is operative to connect and disconnect the first latch input terminal to a reference voltage source responsive to an output signal at the buffer output terminal and to a first latch control signal. A second switching circuit is operative to connect and disconnect the second latch input terminal to the reference voltage source responsive to an output signal at the buffer output terminal and to a second latch control signal. A third switching circuit is operative to connect and disconnect the first latch output terminal to the reference voltage source responsive to an output signal at the buffer output terminal and to a third latch control signal. A reset circuit may be connected to the latch output terminals of the first and second latch circuits and operative to set the latch output terminals at a reference voltage source responsive to a reset signal.

16 Claims, 5 Drawing Sheets

MULTILEVEL MEMORY DEVICES WITH MULTI-BIT DATA LATCHES

FIELD OF THE INVENTION

The present invention relates to integrated circuit memory devices, and more particularly, to multi-level memory devices.

BACKGROUND OF THE INVENTION

Conventional nonvolatile memory devices include mask read-only memories (ROMs), electrically erasable programmable read-only memories (EEPROMs), and flash EEPROMs. These conventional nonvolatile memory devices typically include memory cells that can store one of two information states, e.g., an "ON" state and an "OFF" state. In order to store N-bits of data, N single-bit memory cells are typically used.

Many conventional transistor-type one-bit memory cells define logical states using the threshold voltage of a transistor, e.g., the state of data stored in a transistor may be distinguished by the level of the threshold voltage of the transistor. In a typical mask ROM, for example, threshold voltage for a cell transistor is controlled by injection of ions using ion implantation techniques. In typical EPROMs, EEPROMs and flash EEPROMs, threshold voltage for a cell transistor is controlled by controlling the amount of charge stored in a floating gate of the transistor.

Threshold voltage control can be used to implement a transistor memory cell that is capable of representing multiple bits of information. For example, as illustrated in FIG. 1, cell transistors of a mask ROM may be programmed with logical values "00", "01", "10" or "11", by setting their threshold levels at a value falling within one of four ranges around nominal threshold voltages Vth1, Vth2, Vth3, Vth4.

To determine the logical state of such a multi level cell, a series of different word line voltages are applied to the cell, as illustrated in FIG. 2. In particular, a word line connected to memory cell is driven at a first word line voltage $V_{WL1}$ while determining the presence or absence of a current through the memory cell at a first sensing point using, for example, a sense amplifier circuit. The word line is then driven at a second word line voltage $V_{WL2}$ higher than the first word line voltage $V_{WL1}$, and the presence or absence of current through the memory cell is determined at a second sensing point. Finally, a third word line voltage $V_{WL3}$ higher than the first and second word line voltages $V_{WL1}$ and $V_{WL2}$ is applied to the word line, and the presence or absence of a current flowing through the cell is determined at a third sensing point. As illustrated in FIG. 3, the order in which the word line voltages are applied can be varied. An example of such a data reading operation is described in U.S. Pat. No. 5,457,650 to Sugiura et al.

Outputs from a sense amplifier of a multi-level memory typically are logically combined by an output circuit to produce a multi-bit output. To maintain small chip size, this output circuit desirably has a low number of components.

SUMMARY OF THE INVENTION

In light of the foregoing, it is an object of the present invention to provide a data latch for a multi-level memory device having a configuration that is amenable to high levels of device integration.

This and other objects, features and advantages are provided according to the present invention by multilevel memory devices and data latches which include a gated buffer that receives sense amplifier output signals and feeds first and second latch circuits that are controlled by three switching circuits. The switching circuits are responsive to a sequence of latch control signals generated in a read cycle to latch a two-bit value corresponding to the programmed threshold value of a memory cell connected to the sense amplifier.

In particular, according to the present invention, a multi-bit data latch includes a gated input buffer having a buffer input terminal, a buffer output terminal, and a buffer control terminal. The gated input buffer provides an output signal at the buffer output terminal responsive to an input signal applied to the buffer input terminal subject to a buffer control signal at the buffer control terminal. A first latch circuit has a first latch output terminal and a first latch input terminal, and a second latch circuit has a second latch output terminal and a second latch input terminal. A first switching circuit is operative to connect and disconnect the first latch input terminal to a reference voltage source, e.g., a signal ground, responsive to an output signal at the buffer output terminal and to a first latch control signal. A second switching circuit is operative to connect and disconnect the second latch input terminal to the reference voltage source responsive to an output signal at the buffer output terminal and to a second latch control signal. A third switching circuit is operative to connect and disconnect the first latch output terminal to the reference voltage source responsive to an output signal at the buffer output terminal and to a third latch control signal. A reset circuit may be connected to the latch output terminals of the first and second latch circuits and operative to set the latch output terminals at a reference voltage source responsive to a reset signal.

According to an embodiment of the present invention, a respective one of the first, second and third switching circuits includes a first switch, for example, an NMOS transistor, having a first controlled terminal, a second controlled terminal, and a control terminal connected to the buffer output terminal. A second switch, e.g., another NMOS transistor, has a first controlled terminal connected to the second controlled terminal of the first switch, a second controlled terminal connected to the reference voltage source, and a control terminal configured to receive a latch control signal.

According to another embodiment of the present invention, the gated input buffer includes a NOR gate having a first input terminal configured to receive an input signal, a second input terminal configured to receive a buffer control, and an output terminal. A first inverter has an input terminal and an output terminal, the input terminal of the first inverter connected to the output terminal of the NOR gate. A second inverter has an input terminal and an output terminal, the input terminal of the second inverter connected to the output terminal of the first inverter, the output terminal of the second inverter connected to the first, second and third switching circuits.

Methods of operating such data latches and memory devices including such data latches are also described.

DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices.

Figure 4:
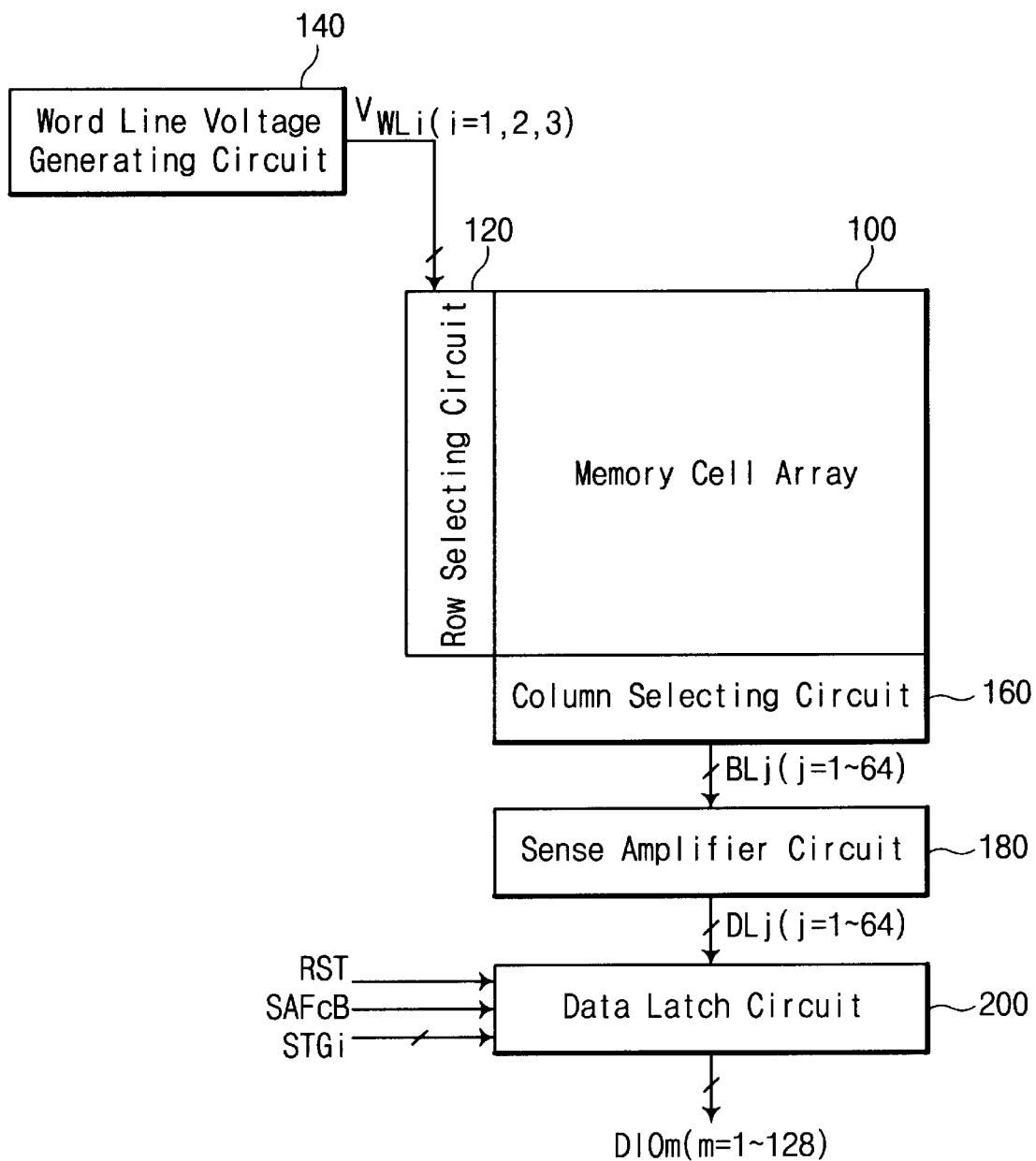
FIG. 4 is a schematic diagram of a multi-level memory device according to an embodiment of the present invention.

Referring to FIG. 4, a multi-level memory device 1 according to an embodiment of the present invention includes a memory cell array 100. The memory cell array 100 includes a plurality of memory cells (not shown), each of which is programmed at one of a plurality of nominal threshold voltage levels Vth1, Vth2, Vth3 and Vth4 using, for example, ion implantation or charge injection into a floating gate electrode. Other components of the memory cell array 100 that are not shown but which are well known to those skilled in the art include a plurality of word lines (not shown) connected to rows of the memory cells of the memory cell array 100, and a plurality of bit lines connected to columns of the memory cells of the memory cell array 100. The word lines are connected to a row selecting circuit 120 that is operative to selectively connect the word lines to a word line voltage generating circuit 140. The row selecting circuit 120 may include, for example, a row address buffer and a row decoder. A word line voltage generating circuit 140 sequentially generates different word line voltages VWLI in reading multi-bit data stored in an addressed memory cell. An example of such a word line voltage generating circuit 140 is described in U.S. Pat. No. 5,457,650 to Sugiura et al.

The bit lines of the memory cell array 100 are connected to a column selecting circuit 160, which may include, for example, a column address buffer, a column decoder, a column pass gating circuit, and a counter. The column selecting circuit 160 is operative to connect one or more of the bit lines of the memory cell array 100 to a sense amplifier circuit 180 (including a plurality of sense amplifiers) during a read operation. For the illustrated embodiment, each sense amplifier of the sense amplifier circuit 180 produces a "high" output when a memory cell connected thereto is in an "ON" (conductive) state, and produces a "low" level when the connected memory cell is in an "OFF" (non-conducting) state. An example of such a sense amplifier circuit 180 is described in U.S. Pat. No. 5,761,132 to Kim, assigned to the assignee of the present invention and incorporated herein by reference in its entirety.

The multi-level memory device 1 further includes a data latch circuit 200. The data latch 200 receives output signals from the sense amplifier circuit 180 in response to a buffer control signal SAFcB and a plurality of latch control signals STGi. The data latch 200 is also responsive to a reset signal RST, which resets the outputs DIOm of the data latch 200 to a predetermined voltage, e.g., signal ground. The buffer control signal SAFcB controls when the output DLj of the sense amplifier circuit 180 is sampled by the data latch 200, while the latch control signals STGi control which of a plurality of latch circuits within the data latch stores a value corresponding to the sense amplifier output DLj.

Figure 5:
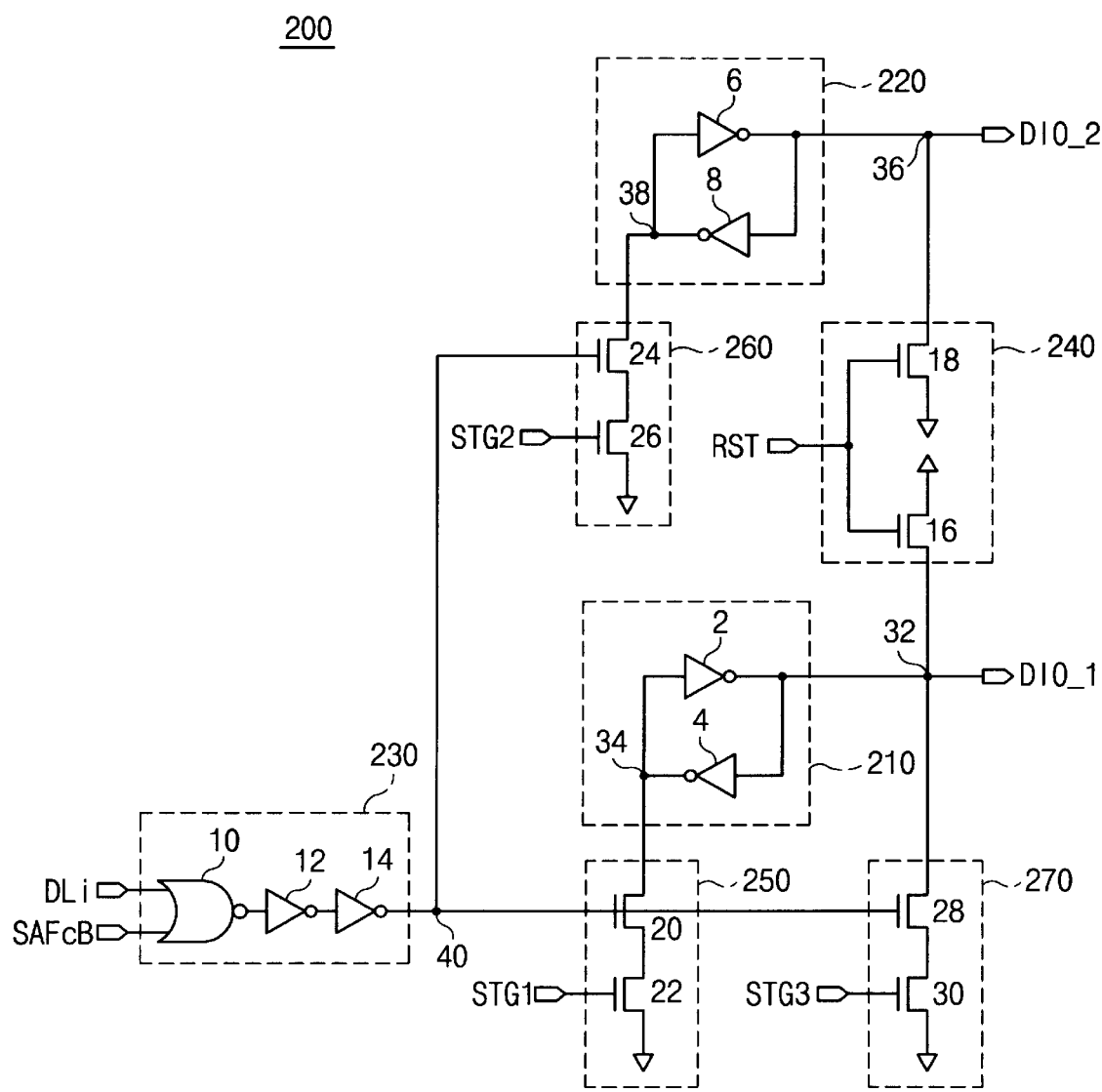
FIG. 5 is a schematic diagram of a data latch circuit according to an embodiment of the present invention.

In an embodiment of the present invention illustrated in FIG. 5, the data latch 200 includes first and second latch circuits 210, 220. The first and second latch circuits 210, 220 include inverters 2, 4, 6, 8 connected in a latch configuration at input terminals 34, 38 and output terminals 32, 36. A first output terminal 32 is coupled to a first data line DIO_1, and a second output terminal 36 is connect to a second data line DIO_2.

A gated buffer 230 is provided, including a NOR gate 10 connected to a series of two inverters 12, 14. The NOR gate 10 has a first input terminal connected to an output DLi of a sense amplifier, such as a sense amplifier of the sense amplifier circuit 180 of FIG. 4. A second input terminal receives the buffer control signal SAFcB.

A reset circuit 240 is connected to the output terminals 32, 36 of the latch circuits 210, 220, and includes two NMOS transistor switches 16, 18 that have control terminals configured to receive a reset signal RST. The reset circuit 240 is operative to initialize the output terminals 32, 36 at a reference potential supplied by a reference voltage source, e.g., a signal ground, responsive to the reset signal RST. The circuit 240 includes two NMOS transistors 16, 18.

First and second switching circuits 250, 260 are connected to the input terminals 34, 38, and a third switching circuit 270 is connected to one of the output terminals 32. The first switching circuit 250 includes first and second NMOS transistor switches 20, 22, and controls latching of data in the first latch circuit 210 responsive to a first latch control signal STG1 and the output of the gated buffer 230 at its output terminal 40. A control terminal (gate) of the first switch 20 is connected to the output terminal 40 of the gated buffer 230, while a control terminal of the second switch 22 is supplied with the first latch control signal STG1.

The second switching circuit 260 includes first and second NMOS transistor switches 24, 26, and controls latching of data in the second latch circuit 220 responsive to a second latch control signal STG2 and the output of the gated buffer 230 at its output terminal 40. A control terminal (gate) of the first switch 24 is connected to the output terminal 40 of the gated buffer 230, while a control terminal of the second switch 26 is supplied with the second latch control signal STG2.

The third switching circuit 270 includes first and second NMOS transistor switches 28, 30, and controls the output terminal 32 of the first latch circuit 210 responsive to a third latch control signal STG3 and the output of the gated buffer 230 at its output terminal 40. A control terminal (gate) of the first switch 28 is connected to the output terminal 40 of the gated buffer 230, while a control terminal of the second switch 30 is supplied with the third latch control signal STG3.

Figure 6:
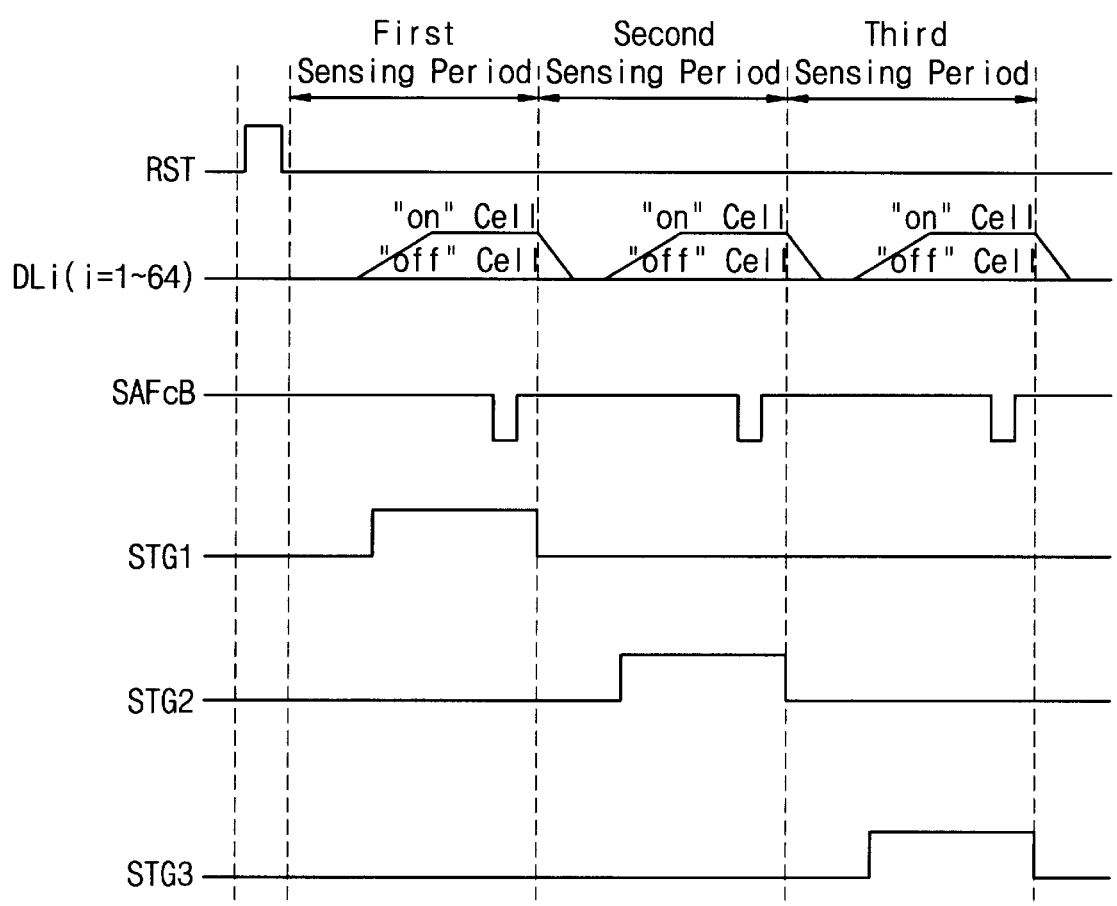
FIG. 6 is a timing diagram illustrating exemplary operations for a data latch circuit according to an embodiment of the present invention.

A timing diagram illustrating exemplary operations for the data latch circuit 200 of FIG. 5 is provided in FIG. 6. The operations of FIG. 6 will be described in reference to FIGS. 4 and 5. In the illustrated embodiment, a nominal threshold voltage Vth1 of a memory cell represents a "00" state, a nominal threshold voltage Vth2 represents a "01" state, a nominal threshold voltage Vth3 represents a "11" state, and a nominal threshold voltage Vth4 represents a "10" state.

As illustrated in FIG. 6, the reset signal RST is taken to a "high" state just prior to the start of a read operation, forcing the output terminals 32, 36 of the latch circuits 210, 220 to signal ground. A selected bit line BLj of the memory cell array 100 is then connected to a sense amplifier of the sense amplifier circuit 180 by the column selecting circuit 160, while a selected word line of the array 100 is connected to the word line voltage generator 140 by the row selecting circuit 120, thus selecting a memory cell of the memory cell array 100 for reading.

During a first sensing period, a first word line voltage $V_{WL1}$ is applied to the selected word line, and a sensing current from the sense amplifier circuit 180 is determined. If the first word line voltage $V_{WL1}$ is greater than the threshold voltage of the selected memory cell, the memory cell is turned "ON," allowing a sensing current to be discharged through the memory cell and causing the selected bit line to go to a "low" voltage. In response, the sense amplifier connected to the selected bit line produces a "high" output signal DLi. If the first word line voltage $V_{WL1}$ is less than the threshold voltage of the selected memory cell, the memory cell is turned "OFF," preventing current flow through the memory cell and causing the selected bit line to go to a "high" voltage. In response, the sense amplifier connected to the selected bit line produces a "low" output signal DLi.

The first latch control signal STG1 is next taken "high," followed by taking the buffer control signal SAFcB to a "low" level. In response, the output terminal of the gated buffer 230 goes to the boolean complement of the sense amplifier output DLi. If the sense amplifier output DLi is "high", the output of the gated buffer 230 goes "low", putting the NMOS transistor 20 of the first switching circuit 250 in a non-conducting state and maintaining the input terminal 34 and the output terminal 32 at their initialized states. If the sense amplifier output DLi is "low", the output of the gated buffer 230 goes "high", putting the NMOS transistor 20 of the first switching circuit 250 in a conducting state and causing the input terminal 34 and the output terminal 32 to toggle from their initialized states.

A similar process occurs during a second sensing period. A second word line $V_{WL2}$ is applied to the selected word line. If the second word line voltage $V_{WL2}$ is greater than the threshold voltage of the selected memory cell, the memory cell is turned "ON," allowing a sensing current to be discharged through the memory cell and causing the selected bit line to go to a "low" voltage. In response, the sense amplifier connected to the selected bit line produces a "high" output signal DLi. If the second word line voltage $V_{WL2}$ is less than the threshold voltage of the selected memory cell, the memory cell is turned "OFF," preventing current flow through the memory cell and causing the selected bit line to go to a "high" voltage. In response, the sense amplifier connected to the selected bit line produces a "low" output signal DLi.

The second latch control signal STG1 is next taken "high," followed by taking the buffer control signal SAFcB to a "low" level. In response, the output terminal of the gated buffer 230 goes to the boolean complement of the sense amplifier output DLi. If the sense amplifier output DLi is "high", the output of the gated buffer 230 goes "low", putting the NMOS transistor 24 of the first switching circuit 260 in a non-conducting state and maintaining the input terminal 38 and the output terminal 36 at their initialized states. If the sense amplifier output DLi is "low", the output of the gated buffer 230 goes "high", putting the NMOS transistor 24 of the second switching circuit 260 in a conducting state and causing the input terminal 38 and the output terminal 36 to toggle from their initialized states.

During a third sensing period, a third word line $V_{WL3}$ is applied to the selected word line. If the third word line voltage $V_{WL3}$ is greater than the threshold voltage of the selected memory cell, the memory cell is turned "ON," allowing a sensing current to be discharged through the memory cell and causing the selected bit line to go to a "low" voltage. In response, the sense amplifier connected to the selected bit line produces a "high" output signal DLi. If the third word line voltage $V_{WL3}$ is less than the threshold voltage of the selected memory cell, the memory cell is turned "OFF," preventing current flow through the memory cell and causing the selected bit line to go to a "high" voltage. In response, the sense amplifier connected to the selected bit line produces a "low" output signal DLi.

The third latch control signal STG1 is taken "high," followed by taking the buffer control signal SAFcB to a "low" level. In response, the output terminal of the gated buffer 230 goes to the boolean complement of the sense amplifier output DLi. If the sense amplifier output DLi is "high", the output of the gated buffer 230 goes "low", putting the NMOS transistor 28 of the third switching circuit 270 in a non-conducting state and maintaining the output terminal 32 at its current state. If the sense amplifier output DLi is "low", the output of the gated buffer 230 goes "high", putting the NMOS transistor 28 of the third switching circuit 270 in a conducting state and causing the output terminal 32 to go to a "low" state.

Figure 1:
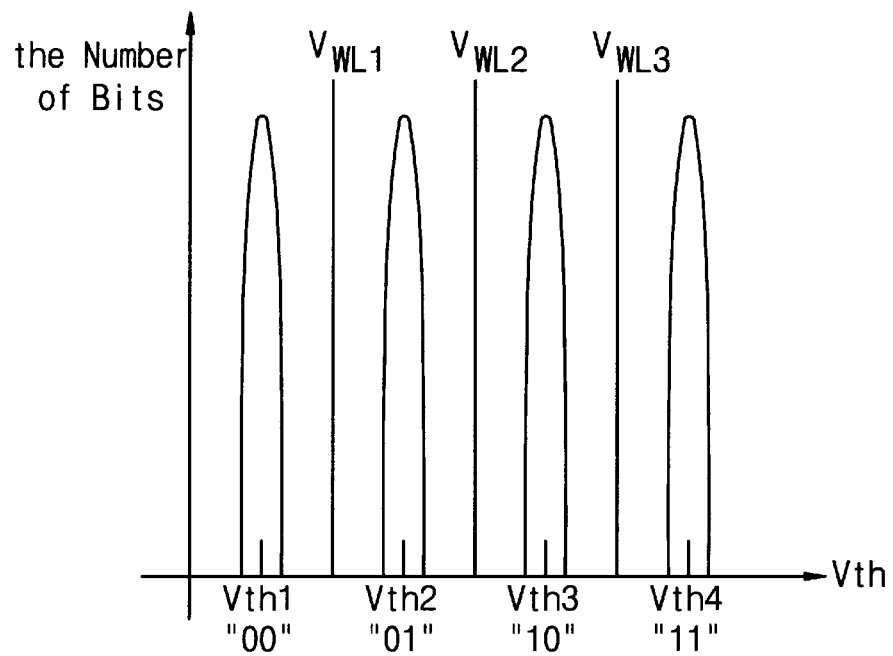
FIG. 1 illustrates threshold voltage distributions for a conventional multi-level memory device.
Figure 2:
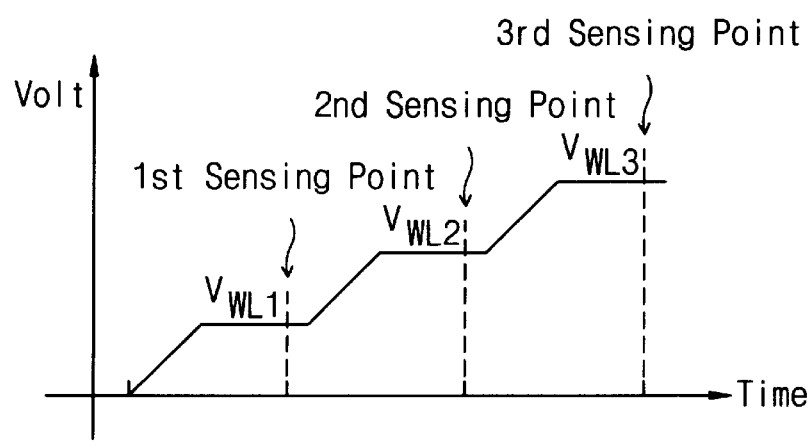
FIGS. 2–3 illustrate conventional operations for reading a multi-level memory cell.
Figure 3:
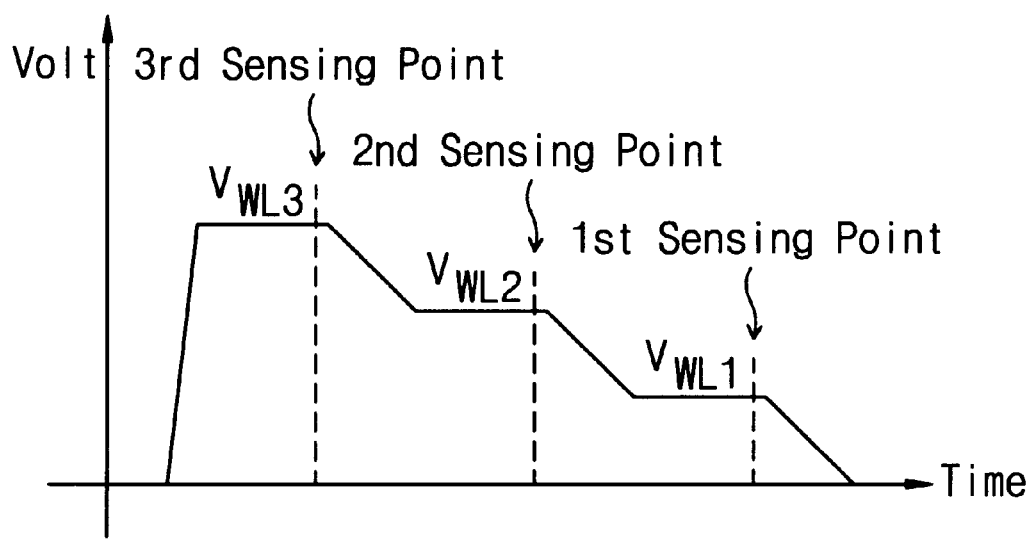

Thus, if the selected memory cell is programmed with a nominal threshold voltage Vth1 (see FIG. 1), a "00" output is produced on the first and second data lines DIO_1, DIO_2 of FIG. 5, where the least significant bit corresponds to data line DIO_1. Similarly, threshold value of Vth2, Vth3, and Vth4 produce respective values "01", "11" and "10" on the first and second data lines DIO_1, DIO_2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A multi-bit data latch for a multilevel memory device, the latch comprising:

a gated input buffer having a buffer input terminal, a buffer output terminal, and a buffer control terminal, said gated input buffer providing an output signal at said buffer output terminal responsive to an input signal applied to said buffer input terminal subject to a buffer control signal at said buffer control terminal;

a first latch circuit having a first latch output terminal and a first latch input terminal;

a second latch circuit having a second latch output terminal and a second latch input terminal;

a first switching circuit operative to connect and disconnect said first latch input terminal to a reference voltage source responsive to said output signal at said buffer output terminal and to a first latch control signal;

a second switching circuit operative to connect and disconnect said second latch input terminal to said reference voltage source responsive to said output signal at said buffer output terminal and to a second latch control signal; and a third switching circuit operative to connect and disconnect said first latch output terminal to said reference voltage source responsive to said output signal at said buffer output terminal and to a third latch control signal.

2. A multi-bit data latch according to claim 1, wherein a respective one of said first and second latch circuits comprises a first inverter and a second inverter connected in a latch configuration such that an input terminal of said first inverter is connected to an output terminal of said second inverter and an output terminal of said first inverter is connected to an input terminal of said second inverter.

3. A multi-bit data latch according to claim 1, wherein a respective one of said first, second and third switching circuits comprises:

a first switch having a first controlled terminal, a second controlled terminal, and a control terminal connected to said buffer output terminal, said first switch operative to control current flow between said first and second controlled terminals responsive to said output signal applied to said control terminal; and a second switch having a first controlled terminal connected to said second controlled terminal of said first switch, a second controlled terminal connected to said reference voltage source, and a control terminal configured to receive a latch control signal, said second switch operative to control current flow between said first and second controlled terminals responsive to said latch control signal applied to said control terminal.

4. A multi-bit data latch according to claim 3, wherein said first and second switches comprise respective first and second transistors.

5. A multi-bit data latch according to claim 1, wherein said reference voltage source comprises a signal ground.

6. A multi-bit data latch according to claim 1, wherein said gated input buffer comprises:
   a NOR gate having a first input terminal configured to receive said input signal, a second input terminal configured to receive said buffer control signal, and an output terminal;
   a first inverter having an input terminal and an output terminal, said input terminal of said first inverter connected to said output terminal of said NOR gate; and
   a second inverter having an input terminal and an output terminal, said input terminal of said second inverter connected to said output terminal of said first inverter, said output terminal of said second inverter connected to said first, second and third switching circuits.

7. A multi-bit data latch according to claim 1, further comprising a reset circuit connected to said latch output terminals of said first and second latch circuits and operative to set said latch output terminals at said reference voltage source responsive to a reset signal.

8. A multi-bit data latch according to claim 7, wherein said reset circuit comprises a switch having a first controlled terminal connected to one of said latch output terminals, a second controlled terminal connected to said reference voltage source, and a control terminal configured to receive said reset signal, said switch operative to control current flow between said first and second controlled terminals responsive to said reset signal applied at said control terminal.

9. A multilevel memory device, comprising:
   a memory cell array comprising a plurality of memory cells;
   a sense amplifier coupled to said plurality of memory cells;
   a gated input buffer having a buffer input terminal connected to said sense amplifier, a buffer output terminal, and a buffer control terminal, said gated input buffer providing an output signal at said buffer output terminal responsive to an input signal applied to said buffer input terminal subject to a buffer control signal at said buffer control terminal;
   a first latch circuit having a first latch output terminal and a first latch input terminal;
   a second latch circuit having a second latch output terminal and a second latch input terminal;
   a first switching circuit operative to connect and disconnect said first latch input terminal to a reference voltage source responsive to said output signal at said buffer output terminal and to a first latch control signal;
   a second switching circuit operative to connect and disconnect said second latch input terminal to said reference voltage source responsive to said output signal at said buffer output terminal and to a second latch control signal; and
   a third switching circuit operative to connect and disconnect said first latch output terminal to said reference voltage source responsive to said output signal at said buffer output terminal and to a third latch control signal.

10. A multilevel memory device according to claim 9, wherein a respective one of said first and second latch circuits comprises a first inverter and a second inverter connected in a latch configuration such that an input terminal of said first inverter is connected to an output terminal of said second inverter and an output terminal of said first inverter is connected to an input terminal of said second inverter.

11. A multilevel memory device according to claim 9, wherein a respective one of said first, second and third switching circuits comprises:
    a first switch having a first controlled terminal, a second controlled terminal, and a control terminal connected to said buffer output terminal, said first switch operative to control current flow between said first and second controlled terminals responsive to said output signal applied to said control terminal; and
    a second switch having a first controlled terminal connected to said second controlled terminal of said first switch, a second controlled terminal connected to said reference voltage source, and a control terminal configured to receive a latch control signal, said second switch operative to control current flow between said first and second controlled terminals responsive to said latch control signal applied to said control terminal.

12. A multilevel memory device according to claim 11, wherein said first and second switches comprise respective first and second transistors.

13. A multilevel memory device according to claim 9, wherein said reference voltage source comprises a signal ground.

14. A multilevel memory device according to claim 9, wherein said gated input buffer comprises:
    a NOR gate having a first input terminal configured to receive said input signal, a second input terminal configured to receive said buffer control signal, and an output terminal;
    a first inverter having an input terminal and an output terminal, said input terminal of said first inverter connected to said output terminal of said NOR gate; and
    a second inverter having an input terminal and an output terminal, said input terminal of said second inverter connected to said output terminal of said first inverter, said output terminal of said second inverter connected to said first, second and third switching circuits.

15. A multilevel memory device according to claim 9, further comprising a reset circuit connected to said latch output terminals of said first and second latch circuits and operative to set said latch output terminals at said reference voltage source responsive to a reset signal.

16. A multilevel memory device according to claim 15, wherein said reset circuit comprises a switch having a first controlled terminal connected to one of said latch output terminals, a second controlled terminal connected to said reference voltage source, and a control terminal configured to receive said reset signal, said switch operative to control current flow between said first and second controlled terminals responsive to said reset signal applied at said control terminal.

* * * * *